(12) United States Patent
Koeppl et al.

(10) Patent No.: US 8,847,575 B2
(45) Date of Patent: Sep. 30, 2014

(54) CIRCUIT ARRANGEMENT

(75) Inventors: Benno Koeppl, Markt Indersdorf (DE); Frank Auer, Roehrmoos (DE); Andreas Kiep, Munich (DE)

(73) Assignee: Infineon Technologies AG, Neubiberg (DE)

( * ) Notice: Subject to any disclaimer, the term of this patent is extended or adjusted under 35 U.S.C. 154(b) by 444 days.

(21) Appl. No.: 13/273,251

(22) Filed: Oct. 14, 2011

(65) Prior Publication Data

US 2013/0093411 A1 Apr. 18, 2013

(51) Int. Cl.
| | |
|---|---|
| *G01R 19/32* | (2006.01) |
| *G01K 7/01* | (2006.01) |
| *H02M 1/32* | (2007.01) |
| *G01R 31/42* | (2006.01) |
| *G01R 31/02* | (2006.01) |
| *H02M 7/5387* | (2007.01) |

(52) U.S. Cl.
CPC ............... *G01K 7/01* (2013.01); *G01R 31/025* (2013.01); *G01K 2217/00* (2013.01); *H02M 7/5387* (2013.01); *H02M 1/32* (2013.01); *G01R 31/42* (2013.01)
USPC ........................................ 324/76.11; 324/105

(58) Field of Classification Search
CPC ............. H02P 6/085; H02P 6/18; H02P 6/08; H02P 7/00; G01R 31/3277; G01R 1/206; G01R 19/00–19/32; G01R 31/42
See application file for complete search history.

(56) References Cited

U.S. PATENT DOCUMENTS

| | | | | |
|---|---|---|---|---|
| 2006/0066271 | A1* | 3/2006 | Yamazaki et al. | 318/140 |
| 2008/0291589 | A1* | 11/2008 | Yokai et al. | 361/33 |
| 2010/0301791 | A1* | 12/2010 | Watanabe et al. | 318/400.35 |

* cited by examiner

*Primary Examiner* — Vinh Nguyen (57) ABSTRACT

According to various embodiments, a circuit arrangement is provided which includes a bridge circuit having at least two field effect transistors and a measurement circuit configured to measure a forward voltage of a body diode of any one of the at least two field effect transistors resulting from a predefined current flowing through the field effect transistor.

20 Claims, 5 Drawing Sheets

FIG. 5 ately 98% of MOSFETs
CIRCUIT ARRANGEMENT

BACKGROUND

The detection of short circuits in driver ICs (integrated circuits) for external driving transistors is mostly realized by monitoring the voltage of the respective transistors, e.g. the voltage between a drain and a source of a field effect transistor. However, the prevalent use of MOSFETs (metal-oxide field effect transistors) with ever lower on-state resistance introduces issues with respect to the protection scheme based on the measurement of the source drain voltage.

Figure 1:
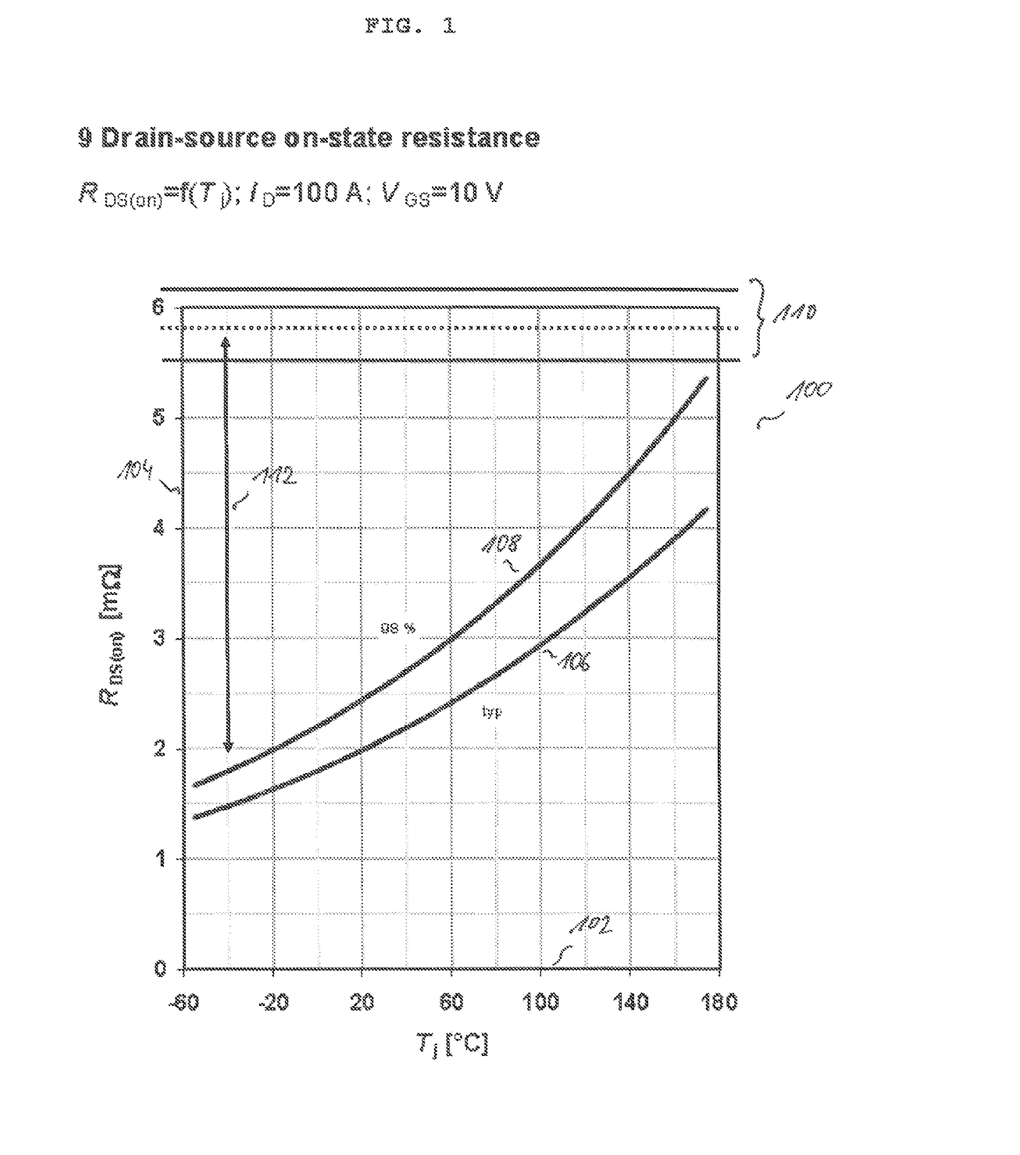
FIG. 1 shows a diagram illustrating a typical short circuit detection scheme based on the temperature dependence of the on-state resistance of a typical MOSFET.

A diagram 100 shown in FIG. 1 illustrates a relation between a temperature of a substrate $T_j$ being represented by an x-axis 102 of the diagram 100 and an on-state resistance $R_{DS(on)}$ of a typical MOSFET being represented by an y-axis 104 of the diagram 100, wherein the MOSFET may be provided on or embedded into the substrate. A first graph 106 shows the relation between the substrate temperature and the on-state resistance for a typical MOSFET, a second graph 108 shows the same relation for approximately 98% of MOSFETs which may be delivered by a manufacturer. In other words, the relation between the substrate temperature and the on-state resistance embodied by the second graph 108 represents an upper bound for 98% of MOSFETs, such that only 2% of MOSFETs from a delivery may have higher resistance values at the respective temperature values. The diagram clearly demonstrates a strong presence of a dependence of the on-state resistance $R_{DS(on)}$ of a MOSFET on the temperature $T_j$ of the MOSFET. Within a typically rated range for the operating temperature of −40° C. to 180° C., for example, the on-state resistance may vary by up to a factor of 3.

In general, an operation state of a MOSFET where the source to drain voltage exceeds a certain threshold voltage is qualified as a short circuit state. In order to prevent a faulty qualification, that threshold voltage is usually set above values which may be reached by hot transistors conducting currents near or equivalent to the rated maximum on-currents. Such a threshold 110 is symbolically indicated by the dashed horizontal line in the diagram 100 shown in FIG. 1, wherein the continuous horizontal lines above and below the dashed horizontal line indicate exemplary standard deviations. A vertical arrow 112 indicates the "protection gap" which is present in the typical protection scheme relying on the monitoring of the source to drain voltage of a MOSFET, owing to the fact that, as explained, the on-state resistance is strongly dependent on the temperature of the MOSFET. In other words, the fixed threshold voltage 110 which is to be exceeded by the source to drain voltage of a MOSFET in the case of a short circuit is estimated assuming a hot MOSFET conducting a high current, e.g. a short circuit current. Therefore, there is a danger that a short circuit state during which a cold MOSFET with a low on-state resistance conducting an even higher current than the short circuit current might not be qualified as a short circuit. This is of course an undesired situation as it might quickly lead to fusing of the MOSFET and thereby to permanent failure of the device.

From theoretical calculations it can be further shown that the presumably quick process of a warming-up of a cold MOSFET conducting high currents might not take place fast enough to raise the on-state resistance of the MOSFET such that the source to drain voltage short circuit threshold voltage can be reached before permanent damage of the device. In general, the MOSFET will burn though before it can get sufficiently warm so that its on-state resistance $R_{DS(on)}$ can increase sufficiently enough for the source to drain voltage $U_{DS}=R_{DS(on)}\cdot I$ to reach or exceed the short circuit threshold voltage, whereupon protection mechanisms can be activated.

In order to close the "protection gap" 112 indicated in diagram 100 in FIG. 1 in the described short circuit protection scheme, the temperature of the MOSFET during operation needs to be known. If the temperature of the MOSFET is roughly known, a cold MOSFET carrying a short circuit current can be distinguished from a hot MOSFET carrying a normal operating current, which would greatly improve the detection scheme.

So far, the temperature of MOSFETS is determined using temperature sensors which might be provided on the PCB (printed circuit board) on which the MOSFETS are arranged or using special temperature sensors which are arranged on MOSFETS. The PCB based temperature measurements have the disadvantage that the measured temperature only reflects a delayed and smoothed out temperature of the MOSFETS. Furthermore, an additional circuit needs to be provided for the evaluation of the signals provided by those sensors. The temperature sensors are mostly based on PTC (positive temperature coefficient) or NTC (negative temperature coefficient) elements. The second option allows for a precise determination of the temperature of a respective MOSFET to which the temperature sensor is attached or in which the temperature sensor is integrated. However, in that case expensive special MOSFETS and complex analyzing circuitry needs to be employed. Furthermore, both solutions also involve substantial additional expenditures.

SUMMARY

According to various embodiments, a circuit arrangement is provided which includes a bridge circuit having at least two field effect transistors and a measurement circuit configured to measure a forward voltage of a body diode of any one of the at least two field effect transistors resulting from a predefined current flowing through the field effect transistor.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which.

DESCRIPTION

The following detailed description refers to the accompanying drawings that show, by way of illustration, specific details and embodiments in which the invention may be practiced.

The word "exemplary" is used herein to mean "serving as an example, instance, or illustration". Any embodiment or design described herein as "exemplary" is not necessarily to be construed as preferred or advantageous over other embodiments or designs.

The word "over" used with regards to a deposited material formed "over" a side or surface, may be used herein to mean that the deposited material may be formed "directly on", e.g. in direct contact with, the implied side or surface. The word "over" used with regards to a deposited material formed "over" a side or surface, may be used herein to mean that the deposited material may be formed "indirectly on" the implied side or surface with one or more additional layers being arranged between the implied side or surface and the deposited material.

Various embodiments provide an efficient way of determining the temperature of a field effect transistor with as little additional circuitry as possible and without the need of special field effect transistors, such as field effect transistors with specially integrated temperature sensing diodes.

The circuit arrangement according to various embodiments enables an efficient temperature measurement of a field effect transistor in the sense that ordinary field effect transistors may be used and no complex or costly additional electronic elements need to be added in order to determine the temperature of the field effect transistor.

The circuit arrangement according to various embodiments also enables a very direct temperature measurement in the sense that the temperature of the field effect transistor is measured by measuring the temperature of the body diode which is inherently present in each field effect transistor. Therefore, influence of other heat sources which can lead to a delayed temperature detection may be reduced to a minimum as the temperature is measured "at the core" of the field effect transistor.

The circuit arrangement according to various embodiments exploits the temperature dependence of the voltage current characteristic of a diode to determine the temperature of the diode, in this case the body diode of a field effect transistor. Here, the temperature dependence plays a key role as the temperature of the diode is a parameter which can be determined from the current flowing through the diode and the voltage drop across the p-n junction of the diode, once the temperature dependent voltage current characteristic is known.

In the case when the circuit arrangement is part of an electric motor drive circuit, the temperature of driver field effect transistors may be determined on the basis of the given circuit architecture without the need of further substantial adaptation of the electric motor drive circuit. The big advantage in such a circuit is that the parameters from which the temperature of the body diode and therefore the temperature of the field effect transistor may be determined are either known or preset or are determined anyways, as will be described in the following.

Figure 2:
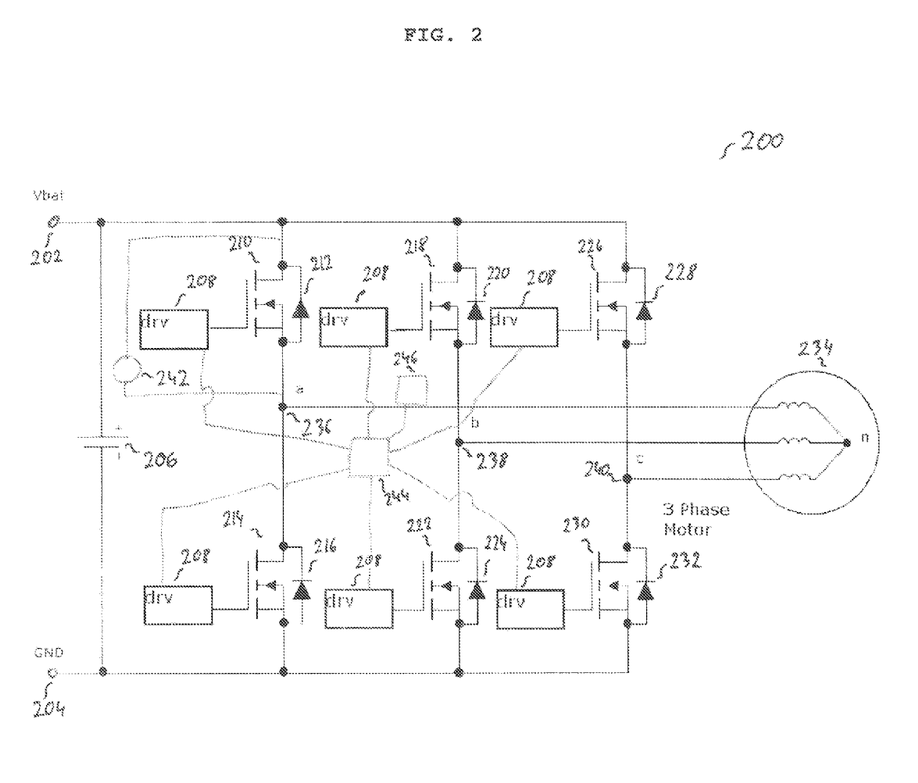
FIG. 2 shows a circuit arrangement according to various embodiments.

In FIG. 2, a circuit arrangement 200 according to various embodiments displayed. For ease of understanding, the circuit arrangement 200 according to various embodiments is illustrated in the technical context of a drive circuit for an electric motor 234. However, it is to be noted that alternative embodiments may be provided in other technical applications, e.g. in other circuits than half bridge circuits or full bridge circuits. The circuit arrangement 200 has a first input 202 and a second input 204, wherein a supply potential, for example provided by a battery, may be connected to the first input 202 and a reference potential, for example the ground potential, may be connected to the second input 204. A capacitor 206 may be provided coupled in parallel to the first input 202 and the second input 204. In this example, the electric motor 234 is a three phase brushless motor requiring three different phases for proper operation. Three pairs of field effect transistors may be coupled between the first input 202 and the second input 204, wherein the two field effect transistors of a respective pair are coupled in series. That is, in various embodiments, a first terminal of a first field effect transistor 210 may be coupled to the first input 202, a second terminal of the first field effect transistor 210 may be coupled to a first terminal of a second field effect transistor 214 and the second terminal of the second field effect transistor 214 may be coupled to the second input 204. Between the first field effect transistor 210 and the second field effect transistor 214 a first node 236 may be provided at which a first phase may be tapped and supplied to the electric motor 234. The first field effect transistor 210 includes a first body diode 212 which is configured to allow a current flow in its conducting direction, e.g. towards the first input 202 and/or the capacitor 206 and/or a third field effect transistor 218 and/or a fifth field effect transistor 226. The second field effect transistor 214 includes a second body diode 216 configured to allow a current flow towards the first field effect transistor 210. A first terminal of the third field effect transistor 218 is coupled to the first input 202, a second terminal of the third field effect transistor 218 is coupled to a first terminal of a fourth field effect transistor 222 and the second terminal of the fourth field effect transistor 222 is coupled to the second input 204. Between the third field effect transistor 218 and the fourth field effect transistor 222 a second node 236 may be provided at which a second phase may be tapped and supplied to the electric motor 234. The third field effect transistor 218 may include a third body diode 220 which may be configured to allow a current flow in its conducting direction, e.g. towards the first input 202 and/or the capacitor 206 and/or the first field effect transistor 210 and/or the fifth field effect transistor 226. The fourth field effect transistor 222 may include a fourth body diode 224 configured to allow a current flow towards the third field effect transistor 218. A first terminal of the fifth field effect transistor 226 may be coupled to the first input 202, a second terminal of the fifth field effect transistor 226 may be coupled to a first terminal of a sixth field effect transistor 230 and the second terminal of the sixth field effect transistor 230 may be coupled to the second input 204. Between the fifth field effect transistor 2226 and the sixth field effect transistor 230 a third node 240 may be provided at which a third phase may be tapped and supplied to the electric motor 234. The fifth field effect transistor 226 includes a fifth body diode 228 which may be configured to allow a current flow in its conducting direction, e.g. towards the first input 202 and/or the capacitor 206 and/or the first transistor 210 and/or the third transistor 218. The sixth field effect transistor 230 includes a sixth body diode 232 configured to allow a current flow towards the third field effect transistor 218. The body diodes of the six field effect transistors are configured as flyback diodes or recovery diodes which is a common practice in bridge circuits, for example in electric motor drive circuits.

The gate of each of the six field effect transistors is coupled to a driver 208 which is configured to drive the gate of each of the field effect transistors individually, i.e. to apply potentials to the gates of the field effect transistors such that they are switched on (i.e. set into a conducting state) or switched off (i.e. set into an isolating state). The representation of the driver 208 in FIG. 1 by several instances is for illustrative purposes, the driver 208 may in fact comprise one single entity. The driver 208 may be coupled to a controller 244 which may be configured to control the operation of the electric motor drive circuit and provide the driver 208 with respective signals indicating when the driver 208 is to switch on and switch off a respective field effect transistor. In general, the driver 208 may be a separate circuit component, but it can also be implemented within the controller 244. In addition, a monitoring circuit 242 may be provided which monitors the voltage between the first terminal and the second terminal (e.g. drain and source) of each of the field effect transistors. In FIG. 2, only one such monitoring circuit 242 is shown, however, a separate monitoring circuit 242 monitoring the voltage between the first terminal and the second terminal (e.g. drain and source) of some or all of the other field effect transistors may be provided just as well. The (one or more) monitoring circuit(s) 242 may be connected to the controller 244. In general, the monitoring circuit 242 may be configured to determine the voltage between the first and the second terminal of a respective field effect transistor and therefore may be used for detecting short circuits by comparing the voltage drop across the respective field effect transistor to a short circuit threshold voltage, as explained above. The monitoring circuit 242, however, may be also used to measure the voltage drop across the body diode of a respective transistor, for example, when the respective transistor is turned off and the current flow is maintained by the corresponding body diode. Furthermore, the circuit arrangement 200 according to various embodiments may be equipped with a control interface, such as a SPI (serial peripheral interface), for control of various functions and parameters of the circuit arrangement 200. In other words, circuit components may be easily added to the circuit arrangement 200 according to various embodiments, for example by their implementation into present or already existing ICs, and be connected to an SPI bus or present circuit components may intercommunicate via an SPI bus and thereby alter or influence the operation of the circuit arrangement 200 according to various embodiments.

The circuit arrangement 200 may further include a temperature determination circuit 246 configured to determine the temperature of the field effect transistors. However, a temperature determination functionality may be also implemented by software, for example in the controller 244 or in the respective driver 208 or the monitoring circuit 242. The temperature determination circuit 246 may be a separate circuit or it may be implemented within or by the controller 244. The controller 244 may be configured to select the field effect transistor the temperature of which is to be measured. The temperature of a respective field effect transistor may be determined by the temperature determination circuit 246 by using the voltage measured by the monitoring circuit 242 when the respective field effect transistor is switched off and current that has been flowing therethrough until its deactivation then flows through the corresponding body diode. In that case, the current flowing through the body diode, which may be a preset or predefined current, for example a load current, is known by the controller 244 as it may be saved as a predefined current value or load current value in a memory element of the controller 244. The value of the predefined current may be known from measurement and/or from a model calculation or simulation. The voltage drop over the body diode may be measured by the monitoring circuit 242, since the body diode is an inherent part in each field effect transistor and therefore shares its terminals. The monitoring circuit 242 may be configured to provide the measured forward voltage of the respective body diode to the controller 244 or directly to the temperature determination circuit 246. The temperature determining circuit 246 may be configured to determine the temperature of the respective body diode and thereby the temperature of the corresponding field effect transistor on the basis of the predefined current flowing through the body diode of the field effect transistor and further on the basis of the forward voltage measured by the monitoring circuit 242. It is once again pointed out that those values are known and/or measured in standard bridge circuits for driving electric motors by default, hence the circuit arrangement 200 according to various embodiments allows for a temperature measurement which relies on the circuit architecture as provided by default. The temperature determination circuit 246 may have to be additionally provided, either as a separate circuit or as a module implemented into the controller 244. The temperature determination circuit 246 may be embedded into the existing communication architecture of a standard bridge circuit for driving an electric motor, for example, via the SPI. In general, a decentralized architecture may be also provided, wherein the monitoring circuit 242 and/or the controller 244 and/or the temperature determining circuit 246 or the corresponding functionalities may be implemented in each of the drivers 208.

Figure 3:
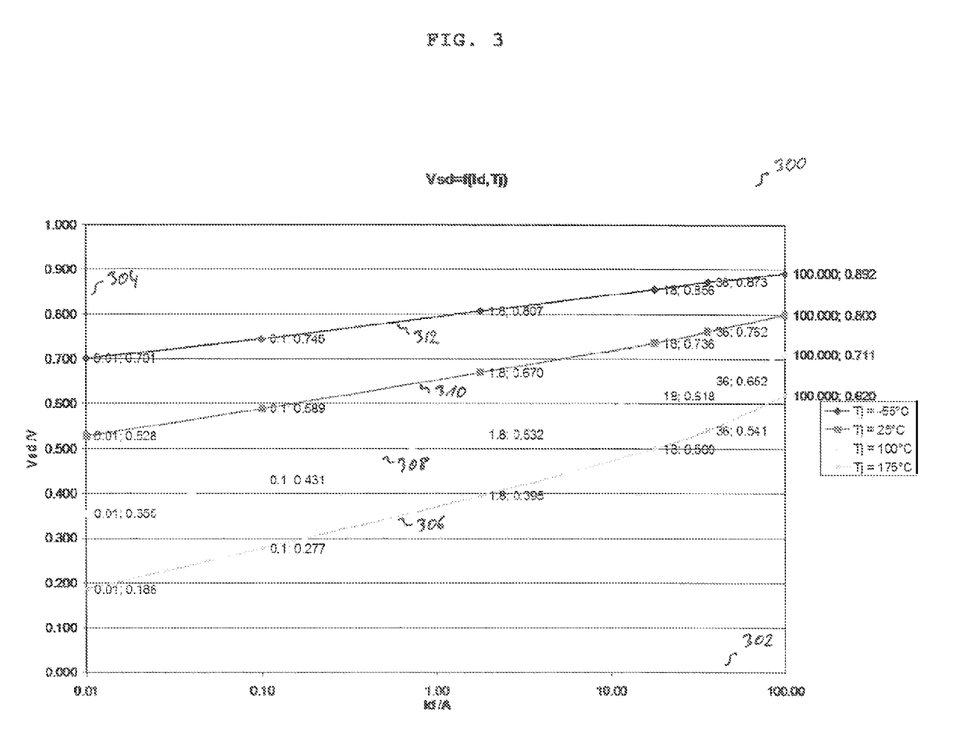
FIG. 3 shows a diagram presenting an exemplary current-voltage characteristic of a diode.

In diagram 300 of FIG. 3, an exemplary voltage current characteristic of the body diode is shown. The x-axis 302 of the diagram denotes the current flowing through the body diode in amperes, the y-axis 304 denotes the voltage across the body diode in volts. The temperature dependence manifests itself in the presence of, in this exemplary case, 4 different graphs. A first graph 306 shows the relation between the current and the voltage at 175° C., a second graph 308 shows the relation between the current and the voltage at 100° C., a third graph 310 shows the relation between the current and the voltage at 25° C. and finally a fourth graph 312 shows the relation between the current and the voltage at −55° C. The diagram 300 clearly demonstrates that the voltage across the body diode at a given current increases with decreasing temperature of the body diode. If the voltage characteristic of the body diode is known, then the temperature of the body diode can be simply derived from the current flowing through the body diode and the voltage induced by that current. In the circuit arrangement 200 according to various embodiments, the controller 244 may store data corresponding to voltage current characteristics of the body diodes of the transistors, wherein two or more field effect transistors may have the same body diode voltage current characteristic. In that case, the temperature determination circuit 246 may request information about the voltage current characteristics of the body diodes of the transistors from the controller 244 when needed. The circuit arrangement 200 according to various embodiments may further include a calibration functionality, such that deviations from standard current voltage characteristics may be determined for at least one of the body diodes, for example, by the controller 244 and used during operation of the circuit arrangement 200, which may increase the overall accuracy and reliability of the operation of the circuit arrangement 200. However, the data corresponding to the voltage current characteristics of the body diodes of the transistors may be stored in the temperature determining circuit 246 as well, such that it may be configured to autonomously calculate or determine the temperature of a respective field effect transistor. The data corresponding to voltage current characteristics of the body diodes of the transistors may be stored, for example, in the form of a matrix or table or in the form of a mathematical formula from which the temperature may be calculated. In general, the voltage current characteristics of diodes tend to remain constant over the time and are hardly subject to aging effects. Therefore, once a voltage current characteristic is known, it may be safely used over lifespan of a diode as a reliable basis for determination of its temperature in the circuit arrangement 200 according to various embodiments.

The voltage current characteristics may be assumed to be the same for body diodes of field effect transistors belonging to the same batch during production, so that the risk of too high spread of device parameters may be reduced. However, one or more field effect transistors of a respective circuit arrangement 200 according to various embodiments may be used for calibration. In addition, field effect transistors delivered by a manufacturer, where different batches are mixed together, may be subject to sorting, i.e. they may be divided into different groups in accordance with the similarity of their characteristic parameters, which may enable the use of all devices from a delivery.

In the following, the measurement process which advantageously may take place during normal operation of the circuit arrangement 200 according to various embodiments will be explained on the basis of the diagrams shown in FIGS. 4A through 4C. Since the three branches each generating a single phase are equivalent concerning their functionality, the following description will be restricted to the first branch, i.e. the branch including the first transistor 210 and the second transistor 212.

Figure 4A:
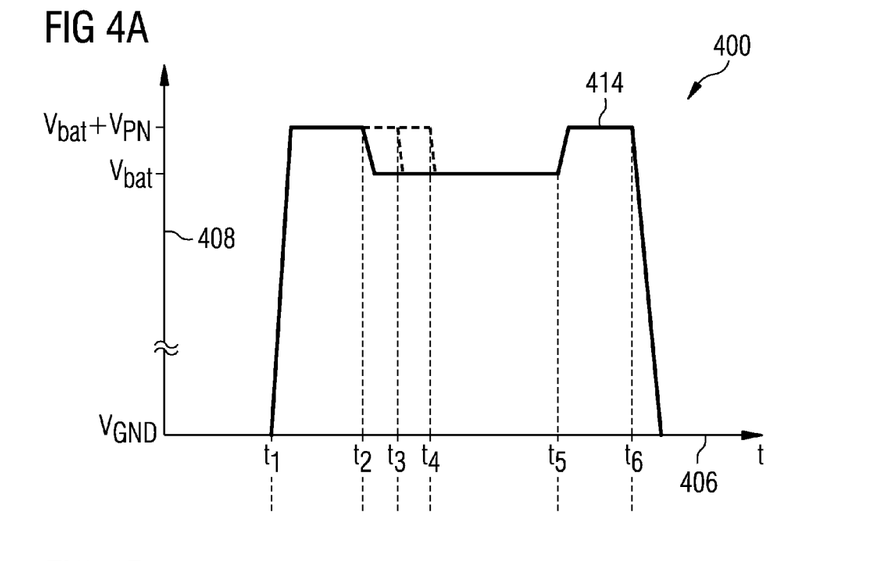
FIGS. 4A through 4C show the configuration of a driving scheme of transistors within the circuit arrangement according to various embodiments.
Figure 4B:
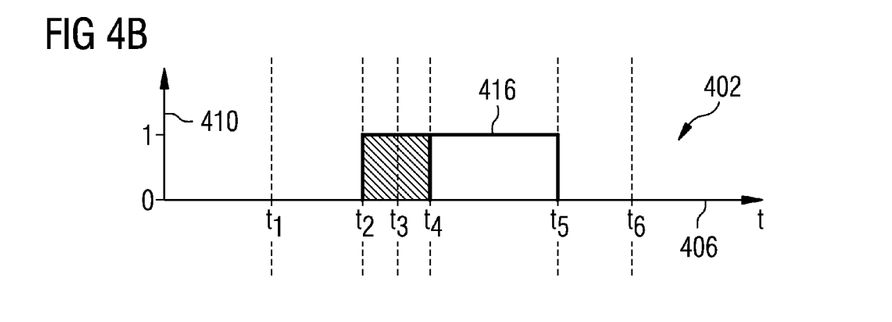
Figure 4C:
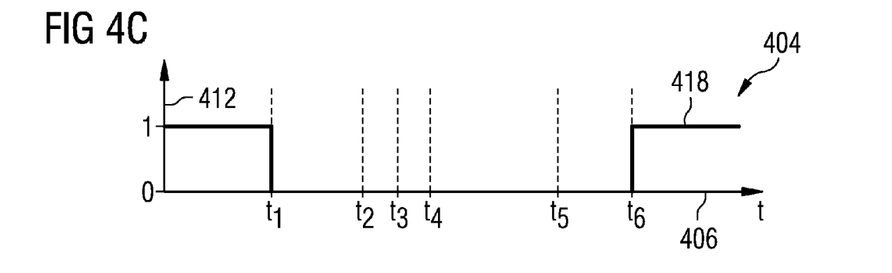

In diagram 400 of FIG. 4A, the graph 414 shows the course of the potential provided at the first node 236. The x-axis 406 denotes the time and the y-axis 408 denotes the voltage at the first node 236. In diagram 402 of FIG. 4B, a driving signal 416 provided at the gate of the first field effect transistor 210 is shown. The x-axis 406 denotes the time in and the y-axis 410 denotes a logic state of the transistor, wherein "0" corresponds to OFF-state (i.e. transistor is isolating) and "1" corresponds to ON-state (i.e. transistor is conducting). In diagram 404 of FIG. 4C, the driving signal 418 provided at the gate of the second field effect transistor 214 is shown, wherein the axes are labelled in the same manner as the axes of the diagram 402 shown in FIG. 4B. The x-axes 406 in each of the diagrams representing time are synchronised, which means that a designated point in time $t_x$ in all three diagrams corresponds to the same point in time.

At a time $t_1$, the second field effect transistor 214 is deactivated. The potential at the first node 236 is increasing since the current from the electric motor 234 continues to flow towards the supply potential through the first body diode of the first field effect transistor 210. In this example the supply potential corresponds to a potential provided by a battery, $V_{BAT}$. Shortly after the time $t_1$ (owing to rise times and similar effects) the potential at the first node 236 corresponds to the battery potential $V_{BAT}$ increased by the voltage of the body diode, $V_{PN}$. In order to avoid a shoot through, i.e. a situation where both the first field effect transistor 210 and the second field effect transistor 214 are activated at the same time and short circuit path between the first input 202 and the second input 204 is provided, the activation of the first field effect transistor 210 takes place at a later time $t_2$. Between the times $t_1$ and $t_2$ the predetermined current from the electric motor 234 flows through the body diode. During that time, the measuring circuit 242 may determine the voltage across the body diode and provide the result to the controller 244. Since the predefined current flowing through the body diode of the first transistor 210 is known by the controller 244 or by the temperature determination circuit 246, the temperature of the first body diode and hence of the first field effect transistor 210 may be determined. Shortly after the time $t_2$ when the first field effect transistor has been activated, the voltage at the first node 236 drops to $V_{BAT}$ since the current may now flow though the first field effect transistor 210 having a negligible on-state resistance. At time $t_5$ the first field effect transistor 210 is deactivated, however the current continues to flow in the same direction and therefore is conducted by the body diode of the first field effect transistor 210, resulting in an increase of the potential at the first node 236 by the body diode voltage $V_{PN}$ from $V_{BAT}$ to $V_{BAT}+V_{PN}$. At time $t_6$ the second field effect transistor 214 is activated and the potential at the first node 236 is pulled to the reference potential.

As already mentioned, the predefined current from the motor 234 may flow through the body diode of the first field effect transistor 210 between the time $t_1$ and $t_2$. During that time, the measurement circuit 242 may determine the voltage across the body diode of the corresponding transistor. If the time span between the times $t_1$ and $t_2$ is insufficiently long for a precise measurement, the time at which the first field effect transistor 210 is switched on may be delayed to a later time $t_3$ or $t_4$. In order to implement this functionality, the measurement circuit 242 may be configured to transmit an error signal to the controller 244 indicating a too short measurement time. Alternatively, the controller 244 which is configured to monitor the cycles in which the phases are provided to the electric motor 234 may determine that the time span available for the measurement of the forward voltage of the respective body diode is too short. In any case, the measurement may be flagged as being faulty and in the same cycle or in the next cycle, the corresponding field effect transistor may be switched on at a later time, for example at the time $t_3$ or at the time $t_4$. The postponing of the switch-on time of the respective field effect transistor introduces a very small or negligible deviation from the voltage to be provided, i.e. $V_{BAT}+V_{PN}$ instead of $V_{BAT}$. The instantaneous deviation may be typically on the order of 5% assuming, for example, $V_{BAT}=13.5V$ and $V_{PN}=0.7V$. Taking into account that this deviation is present only for a very short time, the overall integral of the voltage provided at the first node 236 over time is negligibly altered. Typically, the time span between $t_1$ and $t_2$ may amount to a few microseconds, for example 2 microseconds or 1 microsecond. The graph 414 in FIG. 4A shows one half of a cycle of a PWM pulse driving a phase which may be supplied to the electric motor 234. The length of the complete cycle may be on the order of 50 microseconds, the time span between $t_1$ and $t_6$ which amounts to roughly half a cycle may lie in the range between a few and 50 microseconds and may be 20 microseconds, for example. The time span between time $t_4$ and $t_1$, i.e. an exemplary extended measuring interval, may typically be on the order of 10 microseconds. In a typical measurement scheme, one of the phases may have an increased voltage of approximately 14.3V instead of 13.5V for a typical measurement time of 10 microseconds (time span between $t_1$ and $t_4$ or time span between $t_5$ and $t_6$), wherein such a measuring event may take place every 10 milliseconds. Remembering that one cycle may be on the order of 50 microseconds, the overall error which may be introduced through an extension of the measurement interval should be on the order of $10^{-4}$ and therefore may be neglected. This also shows the "minimal invasiveness" of the measuring procedure in the circuit arrangement according to various embodiments.

It is important for the circuit arrangement 200 according to various embodiments to know when a measurement interval may be extended. In cases, where the time interval between time $t_5$ and $t_6$ (where there is also a flow of the predefined current from the electric motor 234 through the body diode of the first transistor 210 such that the measuring circuit may be configured to determine the forward voltage of the body diode during that time interval) is sufficiently long, it may also be used for measurement. However, extending that interval would introduce a substantial error, since in this case a voltage $V_{BAT}+V_{PN}$ would be provided instead of the ground potential voltage $V_{GND}$. For this reason, the controller 244 may flag switch-on or switch-off times as soft events. In other embodiments, the temperature determination circuit 242 or the measurement circuit 242 may be configured to flag switch-on or switch-off events as soft events, i.e. be configured to control the time management of the overall switching scheme as presented in FIG. 4A through FIG. 4C. A soft event means that the point in time for its execution may be delayed. The flag may also include a delay time which corresponds to a maximum time by which the switch-on time or switch-off time may be delayed. When requested by the controller 244 or the temperature determining circuit 246, the gate driver 208 may delay the respective switch-on time or switch-off time of a respective field effect transistor only if that event is flagged as a soft event. In the exemplary driving signal 416 shown in diagram 402 in FIG. 4B, the switch-on time $t_2$ is a soft event and the delay time, corresponding to the time difference between time $t_2$ and $t_4$, is indicated by the hatched area. Since the hatched area extends up to time $t_4$, the switching on of the first field effect transistor 210 may be delayed (from time $t_2$) up to time $t_4$. The slight disturbances of the possibly introduced delays to guarantee for an accurate measurement of the forward voltage of the body diode by the measurement circuit 242 may be also easily compensated (owing to their "diminutiveness") by a motor control circuit monitoring the rotation speed of the electric motor 234 or another parameter, such as the torque generated by the electric motor 234. It is to be noted that the time $t_4$ in diagram 400 of FIG. 4A may also extend up to time $t_5$ if such an extension of measurement time is necessary. The controller 244 may be configured to ensure that time $t_4$, which marks the end of the extended measurement interval, coincides with time $t_5$ at the most but never extends past time $t_5$. The maximum time that may be used for measurement may be the time span between time $t_1$ and $t_6$. In case the measurement interval extends beyond time $t_6$, the measurement may be flagged as being faulty.

In order to obtain a correct measurement of the forward voltage of the respective body diode, a constant current direction needs to be maintained during the measurement process. Therefore, some measurement intervals may be precluded from the measurement since they may be too short for a proper measurement or the current flowing through the respective body diode may change its direction. Those conditions may be detected by the measurement circuit 242 and the resulting measured voltage values may be flagged as being faulty, i.e. they will be not used by the temperature determination circuit 246 for determining the temperature of the respective field effect transistor. Alternatively, the controller 244 which may be configured to monitor the overall operation of the drive circuit for the electric motor 234 may indicate unusable measurement intervals to the measurement circuit 242 or the temperature determination circuit 246.

Figure 5:
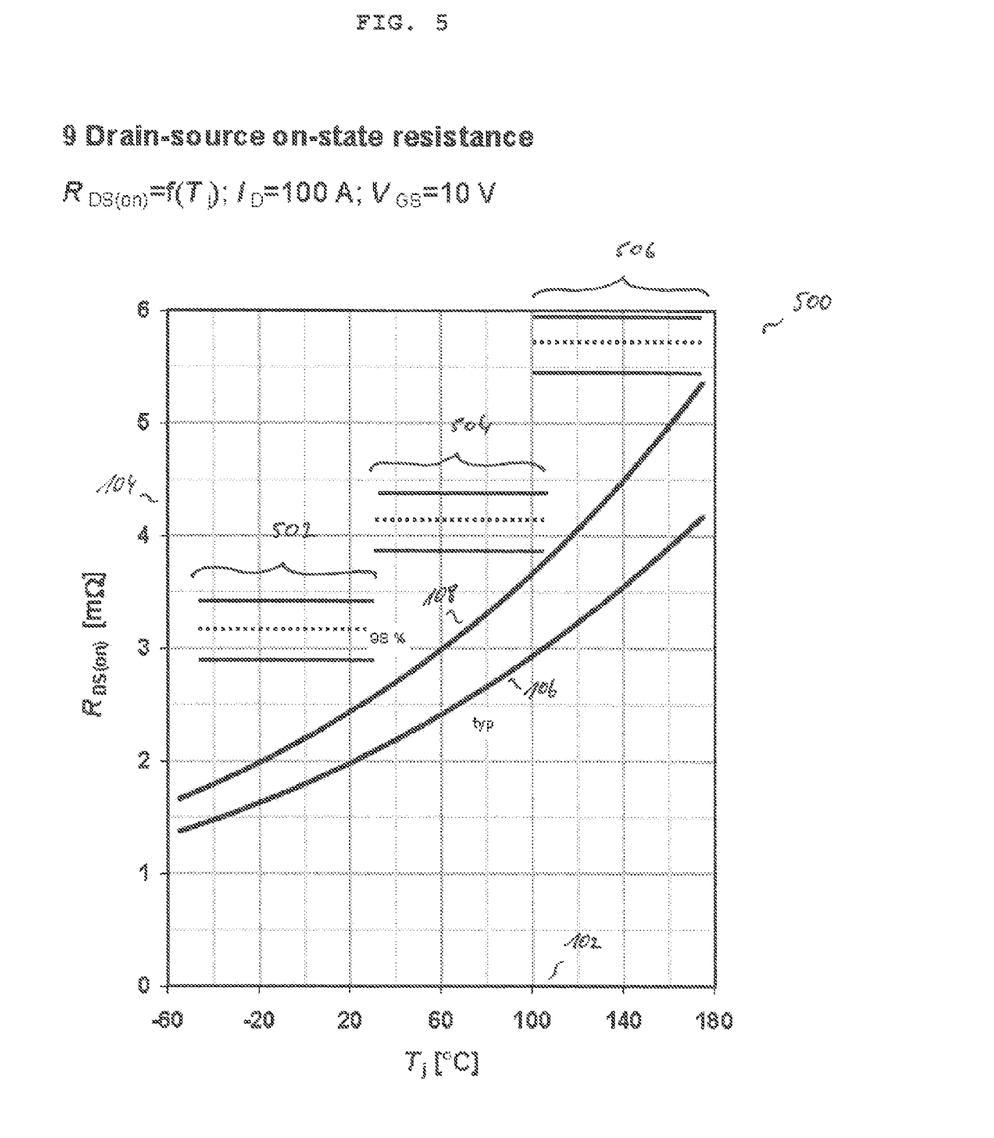
FIG. 5 shows a diagram illustrating an improved short circuit detection scheme based on the temperature dependence of the on-state resistance of a typical MOSFET.

In FIG. 5, a diagram 500 representing the improved short circuit detection scheme based on a variable short circuit threshold is shown. The diagram 500 is equivalent to the diagram 100 shown in FIG. 1, therefore the same elements have been assigned the same reference numbers and will not be described again. The difference with respect to the diagram 100 shown in FIG. 1 illustrating the fixed short circuit threshold 110 is the variable short circuit threshold which in this case includes three different short circuit threshold values. A first short circuit threshold 502 may be used when the field effect transistor is determined to be cold, wherein the cold field effect transistor might have a temperature in the range between −40° C. and 25° C., for example. A second short circuit threshold 504 may be used when the field effect transistor is determined to be warm, wherein the warm field effect transistor might have a temperature in the range between 25° C. and 105° C., for example. A third short circuit threshold 506 may be used when the field effect transistor is determined to be hot, wherein the hot field effect transistor might have a temperature in the range between 110° C. and 180° C., for example. By adjusting the short circuit threshold voltage to the temperature of a respective field effect transistor by dividing the fixed short circuit threshold 110 in diagram 100 of FIG. 1 into several individual short circuit thresholds, the "protection gap" 112 may therefore be avoided.

The exemplary subdivision of the fixed single-valued short circuit threshold presented in FIG. 5 is of course one of very many possible scenarios. The subdivision may include finer intervals which do not have to be of the same size or extent, such that temperature ranges in which the field effect transistor is expected to operate most of the time may be subdivided into finer short circuit threshold intervals. The subdivision of the fixed single-valued short circuit threshold 110 may be influenced by the accuracy the voltage measurements performed by the measurement circuit 242, where usually more accurate measurements reasonably allow for a finer subdivision. Furthermore, instead of step-like intervals, a function may be used which defines a short circuit threshold for each temperature.

In summary, the circuit arrangement according to various embodiments offers a better implementation of the short circuit detection scheme. In the case of an electric motor driver circuit, already provided circuit architecture may be used (measuring circuits for monitoring short circuits of field effect transistors, SPI etc.) without need for additional substantial adjustments. The temperature is measured directly at the field effect transistor which allows for the detection of relatively short and/or small temperature fluctuations. The temperature measurement may further increase the functional safety of the circuit arrangement. An increase in the temperature of one of the field effect transistors within the bridge circuit may indicate a reduced or degraded cooling thereof (possibly introduced by delamination) and therefore countermeasures may be taken before an actual damage of the device. Furthermore, the possibility to measure the temperature of each of the field effect transistors in the circuit arrangement according to various embodiments increases redundancy with respect to a solution where only a single temperature sensor is provided on the PCB.

Once the temperature of a respective MOSFET is determined, it may be used to determine or estimate a load current of the respective MOSFET on the basis of its source to drain voltage which is usually monitored by a measurement circuit provided in bridge circuit drivers, in which case the MOSFET may be regarded as a shunt resistor. Therefore, a current measurement in the circuit arrangement according to various embodiments may be double-checked or verified and/or, depending on the desired accuracy of the current measurement, a further current measuring sensor may be omitted as the load current may be calculated from the resistance of the MOSFET obtained on the basis of FIG. 5 once its temperature is known and the source to drain voltage, which is measured anyways. Overall, further temperature sensors which may be provided on the PCB, for example, may be omitted.

The measurement process in the circuit arrangement according to various embodiments may be implemented in several ways. As already mentioned, the controller 244 may control the bridge circuit via the driver 208, i.e. switch on and switch off the field effect transistors. The measurement circuit 242 may then determine the source to drain voltage of the respective transistor and transmit the value in analog or digital form to the controller 244. The controller 244 may then calculate the temperature of the respective field effect transistor on the basis of the measured voltage and the load current of the field effect transistor from the voltage current characteristic of the corresponding body diode. However, some control features may be bestowed on the driver 208. For example, the current voltage characteristic of the body diodes may be stored in the driver 208. The driver 208 may also be configured to initiate a measurement of the current flowing through the respective field effect transistor (in that case, a corresponding measurement circuit for measuring current is to be provided in analogy to the measuring circuit 242). The driver 208 may be configured to autonomously switch off the respective MOSFET in order to initiate a free running mode of the body diode.

In general, the times during which the voltage or current measurements are to be performed may also be determined on the basis of switching times in a previous switching cycle of the respective field effect transistor. Furthermore, special measurement pulses instead of PWM (pulse width modulation) signals as presented in FIG. 4A and FIG. 4B may be used.

It is to be mentioned that the circuit arrangement 200 shown in FIG. 2, which is described in connection with the electric motor 234 shows only one of very many possible applications. The measurement scheme as presented in FIG. 4A through FIG. 4C may implemented in various other environments where half-bridges are employed, for example in DC-DC converters.

In accordance with one implementation of an embodiment, the circuit arrangement may include a bridge circuit comprising at least two field effect transistors and a measurement circuit configured to measure a forward voltage of a body diode of one of the at least two field effect transistors resulting from a predefined current flowing through the field effect transistor.

According to another implementation of the embodiment, the circuit arrangement may further include a temperature determination circuit configured to determine the temperature of the field effect transistor using the measured forward voltage.

According to another implementation of the embodiment of the circuit arrangement, the temperature determination circuit may be further configured to determine the temperature of the field effect transistor using the predefined current flowing through the body diode of the field effect transistor.

According to another implementation of the embodiment of the circuit arrangement, the measurement circuit may configured to determine the temperature of the field effect transistor during operation of the bridge circuit.

According to another implementation of the embodiment of the circuit arrangement, a direction of the predefined current through the body diode of the field effect transistor may remain constant during determination of the temperature thereof.

According to another implementation of the embodiment, the circuit arrangement may further comprise an electric motor coupled with the bridge circuit.

According to another implementation of the embodiment, the circuit arrangement may further include a controller configured to drive a control gate of each of the at least two field effect transistors.

According to another implementation of the embodiment of the circuit arrangement, the controller may be configured to select the field effect transistor the temperature of which is to be measured from the at least two field effect transistors.

According to another implementation of the embodiment of the circuit arrangement, the controller may be further configured to determine the predefined current flowing through the electric motor.

According to another implementation of the embodiment of the circuit arrangement, the controller may be configured to provide a value of the predefined current to the temperature determination circuit.

According to another implementation of the embodiment of the circuit arrangement, the controller may be configured to delay a switch-on time of the field effect transistor.

According to another implementation of the embodiment of the circuit arrangement, the at least two field effect transistors may be configured as power field effect transistors.

In accordance with yet another implementation of the embodiment, the circuit arrangement may include a bridge circuit comprising at least two field effect transistors and a measurement circuit configured to measure a current flowing through a body diode of one of the at least two field effect transistors resulting from a predefined voltage applied to the field effect transistor.

According to yet another implementation of the embodiment, the circuit arrangement may further include a temperature determination circuit configured to determine the temperature of the field effect transistor using the measured current.

According to yet another implementation of the embodiment of the circuit arrangement, the temperature determination circuit may be further configured to determine the temperature of the field effect transistor using the predefined forward voltage through the body diode of the field effect transistor.

According to yet another implementation of the embodiment of the circuit arrangement, the measurement circuit may be configured to determine the temperature of the field effect transistor during operation of the bridge circuit.

According to yet another implementation of the embodiment of the circuit arrangement, a polarity of the predefined voltage of the body diode of the field effect transistor may remain constant during determination of the temperature thereof.

According to yet another implementation of the embodiment, the circuit arrangement may further include an electric motor coupled with the bridge circuit.

According to yet another implementation of the embodiment, the circuit arrangement may further include a controller configured to drive a control gate of each of the at least two field effect transistors.

According to yet another implementation of the embodiment of the circuit arrangement, the controller may be configured to select the field effect transistor the temperature of which is to be measured from the at least two field effect transistors.

According to yet another implementation of the embodiment of the circuit arrangement, the controller may be further configured to determine the predefined voltage of the electric motor.

According to yet another implementation of the embodiment of the circuit arrangement, the controller may be configured to provide a value of the predefined voltage to the temperature determination circuit.

According to yet another implementation of the embodiment of the circuit arrangement, the controller may be configured to delay a switch-on time of the field effect transistor.

According to yet another implementation of the embodiment of the circuit arrangement, the at least two field effect transistors may be configured as power field effect transistors.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. A circuit arrangement, comprising:
a bridge circuit comprising at least two field effect transistors;
a measurement circuit configured to measure a forward voltage of a body diode of one of the at least two field effect transistors resulting from a predefined current flowing through the field effect transistor;
a temperature determination circuit configured to determine the temperature of the field effect transistor using the measured forward voltage and using the predefined current flowing through the body diode of the field effect transistor.

2. The circuit arrangement of claim 1
wherein the temperature determination circuit is configured to determine the temperature of the field effect transistor during operation of the bridge circuit.

3. The circuit arrangement of claim 2,
wherein a direction of the predefined current through the body diode of the field effect transistor remains constant during determination of the temperature thereof.

4. The circuit arrangement of claim 3, further comprising:
an electric motor coupled with the bridge circuit.

5. The circuit arrangement of claim 4, further comprising:
a controller configured to drive a control gate of each of the at least two field effect transistors.

6. The circuit arrangement of claim 5,
wherein the controller is configured to select the field effect transistor the temperature of which is to be measured from the at least two field effect transistors.

7. The circuit arrangement of claim 6,
wherein the controller is further configured to determine the predefined current flowing through the electric motor.

8. The circuit arrangement of claim 7,
wherein the controller is configured to provide a value of the predefined current to the temperature determination circuit.

9. The circuit arrangement of claim 8,
wherein the controller is configured to delay a switch-on time of the field effect transistor.

10. The circuit arrangement of claim 9,
wherein the at least two field effect transistors are configured as power field effect transistors.

11. A circuit arrangement, comprising:
a bridge circuit comprising at least two field effect transistors;
a measurement circuit configured to measure a current flowing through a body diode of one of the at least two field effect transistors resulting from a predefined voltage applied to the field effect transistor;
a temperature determination circuit configured to determine the temperature of the field effect transistor using the measured current and using the predefined forward voltage through the body diode of the field effect transistor.

12. The circuit arrangement of claim 11,
wherein the temperature determination circuit is configured to determine the temperature of the field effect transistor during operation of the bridge circuit.

13. The circuit arrangement of claim 12,
wherein a polarity of the predefined voltage of the body diode of the field effect transistor remains constant during determination of the temperature thereof.

14. The circuit arrangement of claim 13, further comprising:
an electric motor coupled with the bridge circuit.

15. The circuit arrangement of claim 14, further comprising:
a controller configured to drive a control gate of each of the at least two field effect transistors.

16. The circuit arrangement of claim 15,
wherein the controller is configured to select the field effect transistor the temperature of which is to be measured from the at least two field effect transistors.

17. The circuit arrangement of claim 16,
wherein the controller is further configured to determine the predefined voltage of the electric motor.

18. The circuit arrangement of claim 17,
wherein the controller is configured to provide a value of the predefined voltage to the temperature determination circuit.

19. The circuit arrangement of claim 18,
wherein the controller is configured to delay a switch-on time of the field effect transistor.

20. The circuit arrangement of claim 19,
wherein the at least two field effect transistors are configured as power field effect transistors.

* * * * *